United States Patent
Tasic et al.

(10) Patent No.: US 8,351,978 B2
(45) Date of Patent: *Jan. 8, 2013

(54) SYSTEMS AND METHODS FOR ADJUSTING THE GAIN OF A RECEIVER THROUGH A GAIN TUNING NETWORK

(76) Inventors: Aleksandar Tasic, San Diego, CA (US); Christian Holenstein, San Diego, CA (US); Junxiong Deng, San Diego, CA (US)

( * ) Notice: Subject to any disclaimer, the term of this patent is extended or adjusted under 35 U.S.C. 154(b) by 679 days.

This patent is subject to a terminal disclaimer.

(21) Appl. No.: 12/184,608

(22) Filed: Aug. 1, 2008

(65) Prior Publication Data

US 2010/0029323 A1 Feb. 4, 2010

(51) Int. Cl.
*H04M 1/00* (2006.01)
(52) U.S. Cl. ............... 455/550.1; 455/234.1; 455/248.1
(58) Field of Classification Search ............... 455/550.1, 455/234.1, 248.1
See application file for complete search history.

(56) References Cited

U.S. PATENT DOCUMENTS

| | | | |
|---|---|---|---|
| 5,867,778 A * | 2/1999 | Khoury et al. ............... | 455/321 |
| 7,457,605 B2 * | 11/2008 | Thompson et al. ............ | 455/313 |
| 7,460,844 B2 | 12/2008 | Molnar et al. | |
| 7,468,629 B2 * | 12/2008 | Chien .......................... | 327/553 |
| 7,899,426 B2 * | 3/2011 | Tasic et al. .................... | 455/286 |
| 2009/0131007 A1 * | 5/2009 | Molnar et al. ................ | 455/320 |

FOREIGN PATENT DOCUMENTS

| | | |
|---|---|---|
| JP | 2002016462 | 1/2002 |
| JP | 2005244397 A | 9/2005 |
| JP | 2006173868 A | 6/2006 |
| JP | 2008060882 A | 3/2008 |
| JP | 2008160660 A | 7/2008 |
| WO | WO2007115014 A1 | 10/2007 |

OTHER PUBLICATIONS

International Search Report and Written Opinion—PCT/US2009/052583—ISA/EPO—Jan. 29, 2010.
Kim K et al., "A resistively degenerated wide-band passive mixer with low niose figure and +60dBm IIP2 in 0.18 1/4 m CMOS" Radio Frequency Integrated Circuits Symposium, 2008. RFIC 2008, IEEE Piscataway, NJ, US, Jun. 17, 2008, pp. 185-188. ISBN: 978-1-4244-1808-4.

* cited by examiner

*Primary Examiner* — Matthew Anderson
*Assistant Examiner* — David Bilodeau
(74) *Attorney, Agent, or Firm* — Jonathan Velasco; Sayed H. Beladi

(57) ABSTRACT

A circuit is described. The circuit includes a low noise amplifier (LNA), a passive switching core (PSC), a transimpedance amplifier filter (TIA-filter) and a degenerative-impedance gain-tuning network (Zdeg network) having a first Zdeg network input lead, a second Zdeg network input lead, a first Zdeg network output lead and a second Zdeg network output lead, wherein the first Zdeg network input lead is coupled to a first output lead of the LNA and the second Zdeg network input lead is coupled to a second output lead of the LNA, and wherein the first Zdeg network output lead is coupled to a first signal input lead of the PSC and the second Zdeg network output lead is coupled to a second signal input lead of the PSC. The LNA, the Zdeg network, the PSC, and the TIA-filter together form a receiver. A receiver gain is adjusted by the Zdeg network.

30 Claims, 11 Drawing Sheets

| PERFORMANCE CHARACTERISTIC | VALUE |
|---|---|
| NOISE FIGURE (dB) | 2.67 |
| IIP2 (dBm) | 66 |
| TB (dBm) | 82 |
| IIP3 (dBm) | -3.3 |
| VOLTAGE GAIN (dB) | 39.2 |

SYSTEMS AND METHODS FOR ADJUSTING THE GAIN OF A RECEIVER THROUGH A GAIN TUNING NETWORK

TECHNICAL FIELD

The present disclosure relates generally to wireless communication systems. More specifically, the present disclosure relates to systems and methods for adjusting the gain of a receiver through a gain tuning network.

BACKGROUND

Wireless communication devices have become smaller and more powerful in order to meet consumer needs and to improve portability and convenience. Consumers have become dependent upon wireless communication devices such as cellular telephones, personal digital assistants (PDAs), laptop computers, and the like. Consumers have come to expect reliable service, expanded areas of coverage, and increased functionality. Wireless communication devices may be referred to as mobile stations, stations, access terminals, user terminals, terminals, subscriber units, user equipment, etc.

A wireless communication system may simultaneously support communication for multiple wireless communication devices. A wireless communication device may communicate with one or more base stations (which may alternatively be referred to as access points, Node Bs, etc.) via transmissions on the uplink and the downlink. The uplink (or reverse link) refers to the communication link from the wireless communication devices to the base stations, and the downlink (or forward link) refers to the communication link from the base stations to the wireless communication devices.

Wireless communication systems may be multiple-access systems capable of supporting communication with multiple users by sharing the available system resources (e.g., bandwidth and transmit power). Examples of such multiple-access systems include code division multiple access (CDMA) systems, Global System for Mobile Communications (GSM) systems, Wideband Code Division Multiple Access (WCDMA) systems, time division multiple access (TDMA) systems, frequency division multiple access (FDMA) systems, and orthogonal frequency division multiple access (OFDMA) systems.

DETAILED DESCRIPTION

Figures 1, 2:
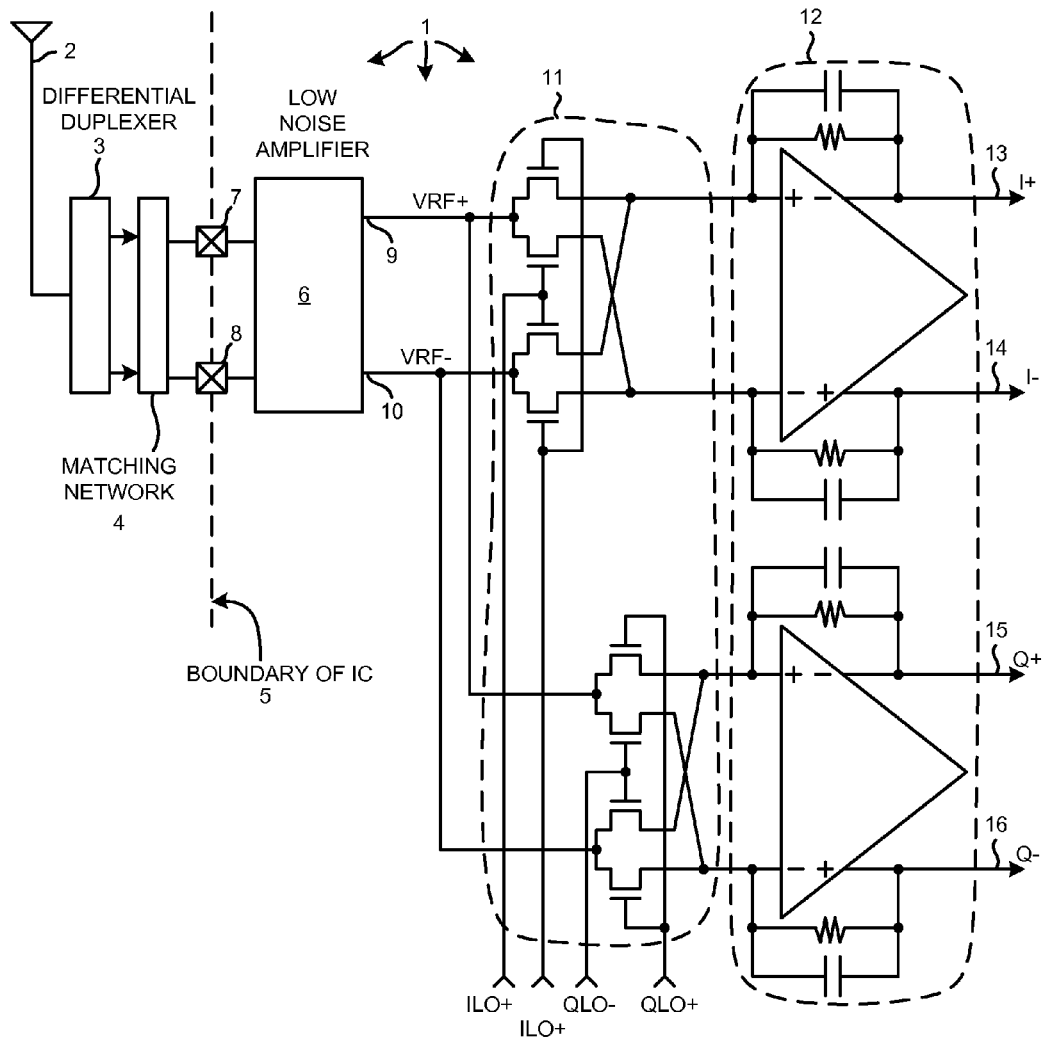
FIG. 1 is a diagram of one type of SAW-less receiver that includes a passive mixer.
FIG. 2 is a table that sets forth performance characteristics for the receiver of FIG. 1 in a high-linearity high-gain mode of operation.

There are several different circuit topologies for realizing a cellular telephone receiver. Some topologies involve a surface acoustic-wave (SAW) filter that is disposed in an incoming radio frequency (RF) signal path between a low-noise amplifier (LNA) and a mixer. It may be desirable to realize a cellular telephone receiver of adequate performance without using the somewhat costly and large SAW device. Other topologies may use a high quality and somewhat expensive LNA matching inductor in the matching network between the antenna and LNA. It may also be desirable to realize the receiver without using this expensive component, but rather by using less expensive low quality components. In order to achieve good linearity in a SAW-less receiver, a purely passive down-converting mixer is sometimes used (i.e., a mixer without an active transconductance amplifier (gm-cell)). It is, however, often difficult for this topology, consisting of an LNA, a passive mixer, and a baseband transimpedance-amplifier (TIA) filter to meet gain-stepping requirements in the Global System for Mobile Communications (GSM) and Wideband Code Division Multiple Access (WCDMA) modes of operation, while still achieving good noise figure (NF) and linearity (i.e., triple-beat (TB)) performance.

In one configuration, extra gain stepping may also be desired for UMB/LTE (Ultra Mobile Broadband/Long Term Evolution) (6 gain modes) to reuse the same 1× signal path (4 gain modes). The systems and methods herein allow for good receiver NF performance across all the gain modes (and standards) of operation without considerably degrading other the performance of other components of the receiver. The performance of the LNA and baseband TIA filter may not be tightly controlled over each receive gain mode. With an inter-stage LNA-mixer passive gain-tuning network, the receiver gain may be changed according to the system requirements while the contribution of the TIA noise to the receiver noise figure remains small.

To meet the gain-stepping requirements in the GSM/WCDMA/UMB/LTE modes of operation using the same CDMA1× signal path, the LNA bias current and matching network and the TIA filter resistor/capacitor network may be tightly controlled. However, this may result in a trade-off between the receiver noise and linearity performance requirements as the system gain is often changed through the LNA and TIA filter. In some examples, when the gain of the system is changed by reconfiguring a downconverting mixer (i.e., gain-stepping mixer), the system noise-figure performance may be considerably degraded. In other words, the contribution of the TIA noise to the system noise figure could become larger than other receiver noise contributions put together.

A circuit is described. The circuit includes a low noise amplifier (LNA), a passive switching core (PSC), a transimpedance amplifier filter (TIA-filter) and a degenerative-impedance gain-tuning network (Zdeg network) having a first Zdeg network input lead, a second Zdeg network input lead, a first Zdeg network output lead and a second Zdeg network output lead, wherein the first Zdeg network input lead is coupled to a first output lead of the LNA and the second Zdeg network input lead is coupled to a second output lead of the LNA, and wherein the first Zdeg network output lead is coupled to a first signal input lead of the PSC and the second Zdeg network output lead is coupled to a second signal input lead of the PSC. The LNA, the Zdeg network, the PSC, and the TIA-filter together form a receiver. A receiver gain is adjusted by the Zdeg network.

A wireless device is also described. The device includes a transmitter and a receiver. The receiver includes a low noise amplifier (LNA) having a first output lead and a second output lead and a passive switching core (PSC) having a first signal input lead, a second signal input lead, a first signal output lead, a second signal output lead, a first local oscillator input lead, and a second local oscillator input lead. The receiver also includes a transimpedance amplifier filter (TIA-filter) having a first input lead, a second input lead, a first output lead, and a second output lead. The receiver further includes a degenerative-impedance gain-tuning network (Zdeg network) having a first Zdeg network input lead, a second Zdeg network input lead, a first Zdeg network output lead and a second Zdeg network output lead. The first Zdeg network input lead is coupled to the first output lead of the LNA and the second Zdeg network input lead is coupled to the second output lead of the LNA. The first Zdeg network output lead is coupled to the first signal input lead of the PSC and the second Zdeg network output lead is coupled to the second signal input lead of the PSC. The LNA, the Zdeg network, the PSC, and the TIA-filter together form a receiver. The receiver gain is adjusted by the Zdeg network.

A circuit is also described. The circuit includes a SAW-less receiver chain having a passive mixer and no active gm-cell. The SAW-less receiver includes a low-noise amplifier (LNA), the passive mixer, and a transimpedance amplifier filter (TIA-filter) that receives a signal output from the passive mixer. The circuit further includes means for providing an impedance in a signal path between the LNA and the passive mixer. A receiver gain is controlled by the means for providing an impedance.

A method for adjusting the gain of a receiver is also described. A degenerative-impedance gain-tuning network (Zdeg network) with one or more transistors and having a first Zdeg network input lead, a second Zdeg network input lead, a first Zdeg network output lead and a second Zdeg network output lead is provided. The first Zdeg network input lead is coupled to a first output lead of a low-noise amplifier (LNA) and the second Zdeg network input lead is coupled to a second output lead of the LNA. The first Zdeg network output lead is coupled to a first signal input lead of a passive switching core (PSC) and the second Zdeg network output lead is coupled to a second signal input lead of the PSC. A transimpedance amplifier filter (TIA-filter) having a first input lead, a second input lead, a first output lead, and a second output lead is provided. The gain of a receiver is adjusted by switching one or more transistors on or off. The LNA, the Zdeg network, the PSC, and the TIA-filter together form the receiver.

FIG. 1 is a diagram of a SAW-less receiver circuit 1 that employs a passive mixer and no active gm-cell. Receiver circuit 1 includes an antenna 2, a differential duplexer 3, an impedance matching network 4, and an integrated circuit 5. Integrated circuit 5 in turn includes an LNA 6, and this LNA may be coupled to receive an incoming RF signal from matching network 4 via two terminals 7 and 8. Two differential output leads 9 and 10 of LNA 6 may be coupled to the passive mixer 11. The coupling of LNA 6 to mixer 11 may be a capacitive coupling via bypass capacitors having large capacitances that are effective shorts at the frequencies of incoming RF signals.

Passive mixer 11 may have two portions. One portion (I-path switching core) may supply a first set of differential signals (I) to a first part of a transimpedance amplifier and filter 12 (I-path TIA-filter). This first part of TIA-filter 12 outputs signals I+ and I− onto output leads 13 and 14. The second portion of passive mixer 11 (Q-path switching core) may supply a second set of Q differential signals to a second part of TIA-filter 12 (Q-path TIA-filter). The second part of TIA-filter 12 outputs the signals Q+ and Q− onto output leads 15 and 16. Unfortunately, it may be difficult to employ the SAW-less passive mixer receiver topology of FIG. 1 and also satisfy stringent noise requirements, while at the same time maintaining good linearity and power consumption performance.

FIG. 2 is a table that sets forth various performance characteristics of the circuit of FIG. 1 for a high-linearity high-gain mode of operation. It is desired to reduce the noise figure (NF) of the circuit without providing a high-quality and expensive discrete LNA input matching inductor in the matching network 4 and without increasing the current consumption of LNA 6.

Figure 3:
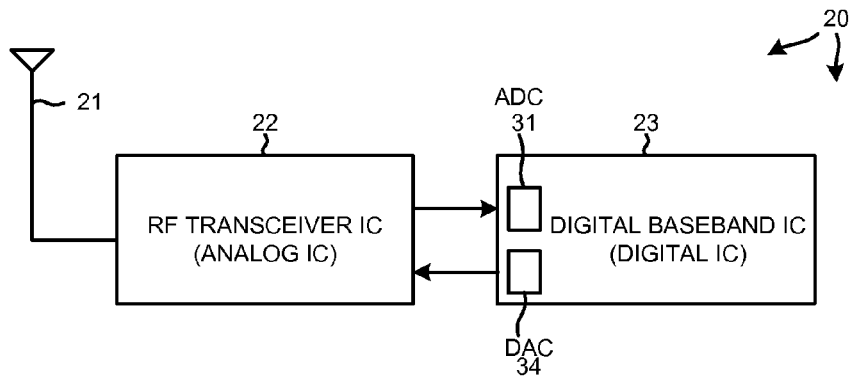
FIG. 3 is a block diagram illustrating one example of a cellular telephone that employs a low-noise SAW-less receiver.

FIG. 3 is a block diagram of a mobile communication device 20. In this example, mobile communication device 20 may be a cellular telephone that uses the WCDMA cellular telephone communication protocol. The cellular telephone may include (among several other parts not illustrated) an antenna 21 and two integrated circuits 22 and 23. Integrated circuit 23 may be referred to as a "digital baseband integrated circuit" or a "baseband processor integrated circuit". Integrated circuit 22 may be an RF transceiver integrated circuit. RF transceiver integrated circuit 22 may be referred to as a "transceiver" because it includes a transmitter as well as a receiver.

Figure 4:
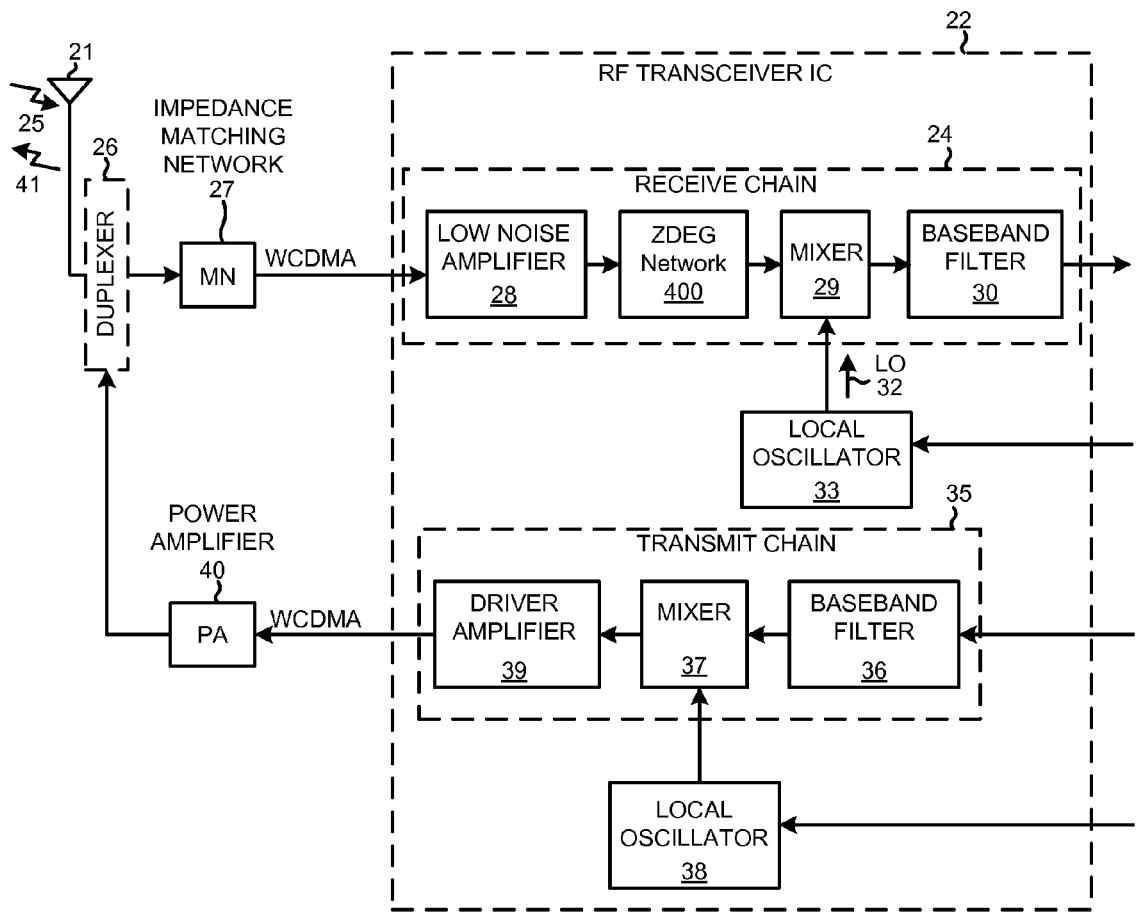
FIG. 4 is a diagram illustrating one example of the RF transceiver integrated circuit of FIG. 3.

FIG. 4 is a block diagram of the RF transceiver integrated circuit 22 of FIG. 3. The receiver may include a "receive chain" 24 as well as a local oscillator 33. When the cellular telephone is receiving, a high frequency RF signal 25 may be received on the antenna 21. The RF signal 25 in one example may be a signal in a MHz frequency range and higher. Information from the RF signal 25 may pass through duplexer 26, impedance matching network 27, and through the receive chain 24. Signal 25 may be amplified by low noise amplifier (LNA) 28, passed through a degenerative impedance network 400 (herein referred to as "Zdeg network") and may be downconverted in frequency by mixer 29. The resulting downconverted signal may be filtered by baseband filter 30 and may be passed to the digital baseband integrated circuit 23. An analog-to-digital converter 31 in the digital baseband integrated circuit 23 may convert the signal into digital form and the resulting digital information may be processed by digital circuitry in the digital baseband integrated circuit 23. The digital baseband integrated circuit 23 may tune the receiver by controlling the frequency of a local oscillator signal (LO) 32 supplied by local oscillator 33 to mixer 29.

If the cellular telephone is transmitting, then information to be transmitted may be converted into analog form by a digital-to-analog converter 34 in the digital baseband integrated circuit 23 and may be supplied to a "transmit chain" 35. Baseband filter 36 may filter out noise due to the digital-to-analog conversion process. Mixer block 37 under control of local oscillator 38 may up-convert the signal into a high frequency signal. Driver amplifier 39 and an external power amplifier 40 may amplify the high frequency signal to drive antenna 21 so that a high frequency RF signal 41 is transmitted from antenna 21.

Figure 5:
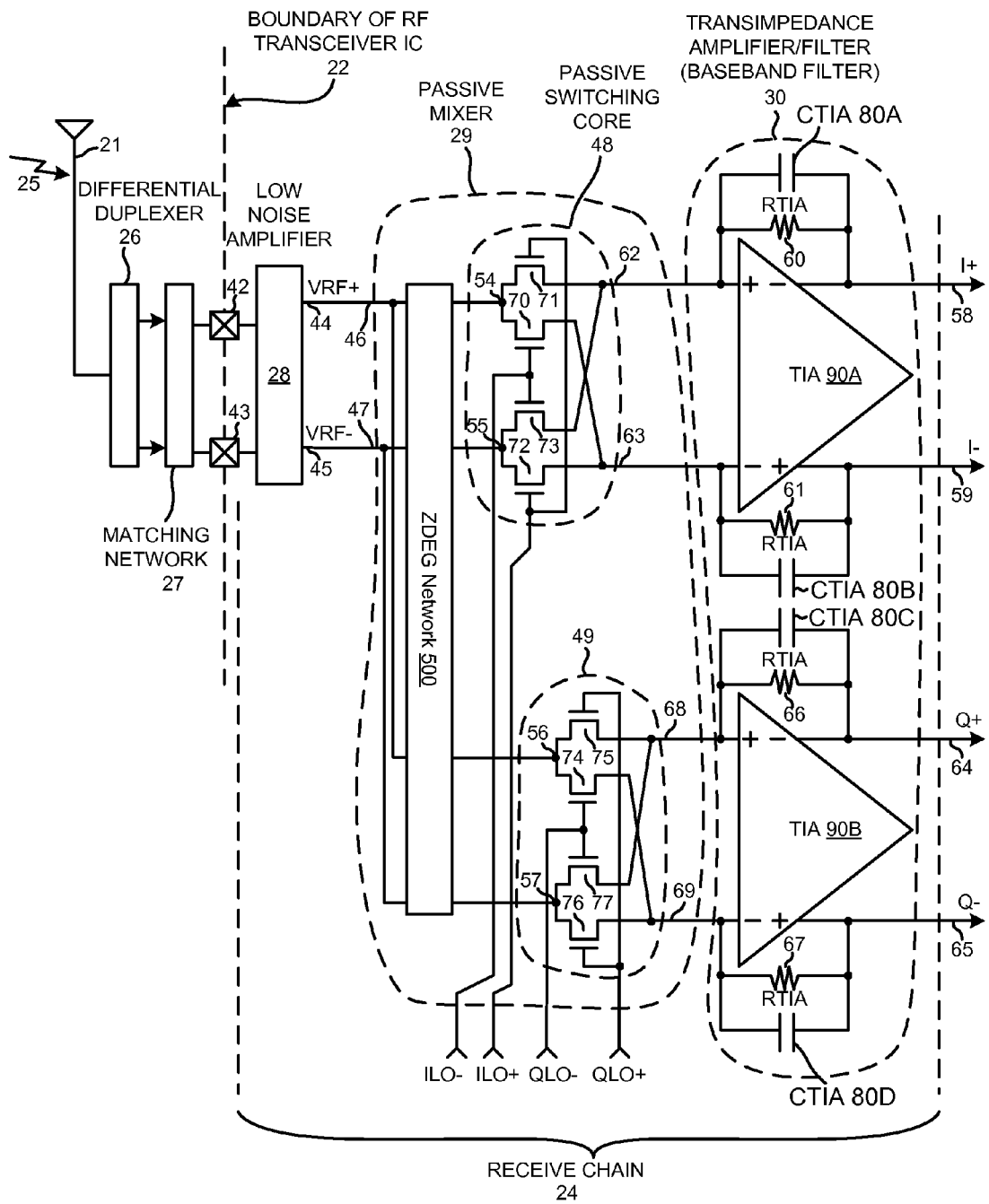
FIG. 5 is a block diagram of the low noise amplifier (LNA), a degenerative-impedance gain-tuning network, passive mixer and transimpedance amplifier (TIA) filter (TIA-filter) of FIG. 4.

FIG. 5 is one example of a circuit diagram for the receive chain 24. Incoming RF signal 25 received on antenna 21 may be coupled through differential duplexer 26 and impedance matching network 27 onto differential input terminals 42 and 43 of integrated circuit 22. LNA 28 may amplify the RF signal 25 and drive differential signals from VRF+ output lead 44 and VRF− output lead 45. VRF+ output lead 44 may be coupled to a first differential input lead 46 of passive mixer 29, and VRF− output lead 45 may be coupled to a second differential input lead 47 of passive mixer 29. Passive mixer 29 may not include an active gm-cell. Passive mixer 29 may include two cross-coupled passive switching cores 48 and 49 and a Zdeg network 500. The Zdeg network 500 is connected to the first output lead 44 of LNA 28 and a first input lead 54 of first switching core 48. The Zdeg network 500 may also be connected to the second output lead 45 of LNA 28, and a second input lead 55 of first switching core 48. In addition, the Zdeg network 500 may be connected to the first output lead 44 of LNA 28, and a first input lead 56 of second switching core 49. In a further configuration, the Zdeg network 500 may be connected to the second output lead 45 of LNA 28, and a second input lead 57 of second switching core 49.

Transimpedance amplifier (TIA) baseband filter (TIA-filter) 30 may include a first portion (I-path part of TIA-filter) and a second portion (Q-path part of TIA-filter). The first portion may drive a pair of differential signals I+ and I− onto differential output leads 58 and 59. The amplifier symbol 90A may represent the I− path transimpedance amplifier (TIA). The resistor symbols 60 and 61 represent the feedback resistance RTIA of the first portion of TIA-filter 30 (I-path TIA-filter). The capacitor symbols 80A and 80B represent the feedback capacitance CTIA of the first portion of the TIA-filter 30 (I-path TIA-filter). The first portion of TIA-filter 30 may receive differential signals from the differential output leads 62 and 63 of first passive switching core 48. Similarly, the second portion of TIA-filter 30 may drive a pair of differential signals Q+ and Q− onto differential output leads 64 and 65. The amplifier symbol 90B may represent the Q-path transimpedance amplifier (TIA). The resistor symbols 66 and 67 represent the feedback resistance RTIA of the second portion of TIA-filter 30 (Q-path TIA-filter). The capacitor symbols 80C and 80D represent the feedback capacitance CTIA of the second portion of TIA-filter 30 (Q-path TIA-filter). The second portion of TIA-filter 30 may receive differential signals from the differential output leads 68 and 69 of second passive switching core 49. Transimpedance amplifiers (TIAs) and resistor/capacitor (RTIA/CTIA) networks determine the gain and low-pass filtering characteristic of the TIA-filter. As indicated by FIG. 5, first passive switching core 48 may include four field effect transistors (FETs) 70-73 and second passive switching core 49 may include FETs 74-77. These FETs may be interconnected as illustrated in FIG. 5.

Figure 6:
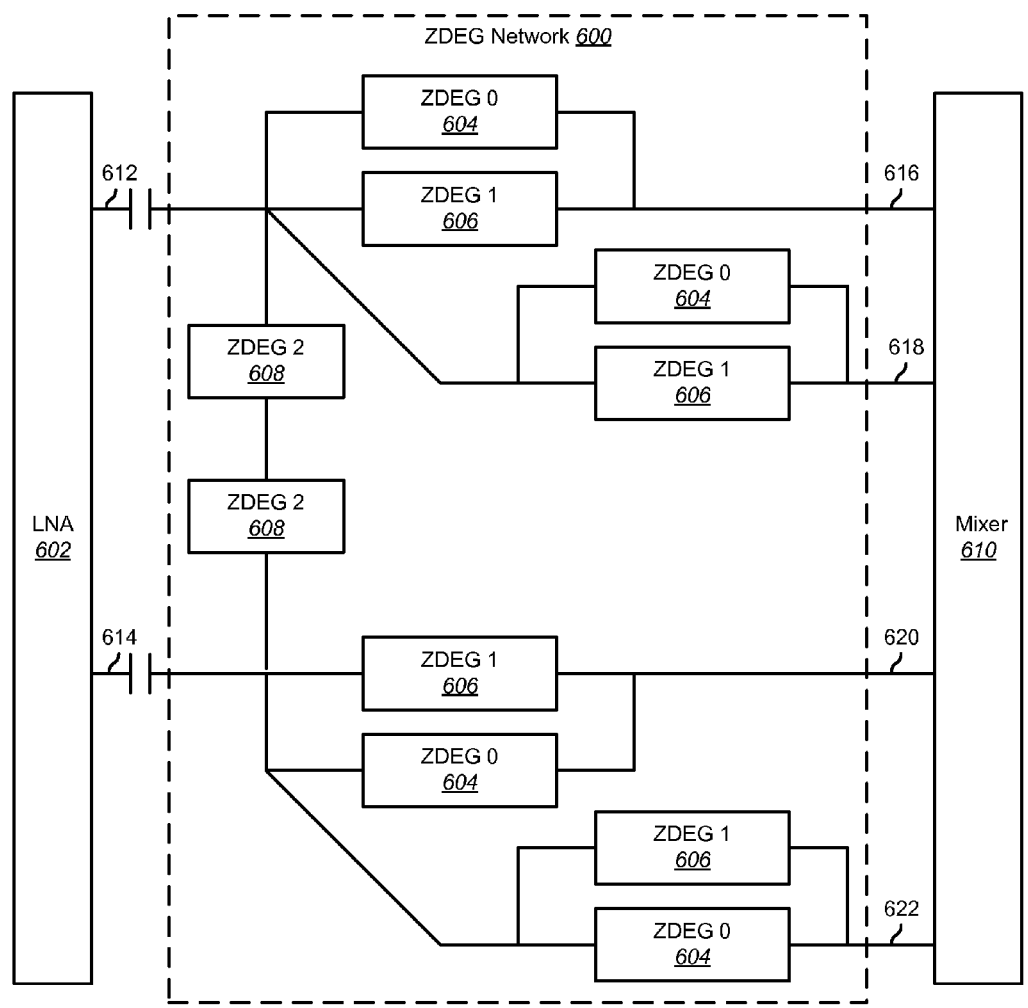
FIG. 6 is a block diagram illustrating a further configuration of a degenerative-impedance gain-tuning network.

FIG. 6 is a block diagram illustrating a further configuration of the Zdeg network 600. The Zdeg network 600 may be used to adjust the gain of a receiver. The network 600 may be positioned between a low noise amplifier 602 (LNA) and a mixer 610. A first RF signal 612 (e.g., RF+) and a second RF signal 614 (e.g., RF−) may be output from the LNA 602 and input to the Zdeg network 600. In addition, a first I phase signal 616 (e.g., I+) and a second I phase signal 620 (e.g., I−) (the in-phase path) may be output from the Zdeg network 600 and input to the mixer 610. Further, a first Q phase signal 618 (e.g., Q+) and a second Q phase signal 622 (e.g., Q−) (the quadrature-phase path) may be output from the Zdeg network 600 and input to the mixer 610.

In one example, the Zdeg network 600 includes one or more Zdeg components. For example, the network 600 may include one or more Zdeg0 604 components and Zdeg1 606 components. In addition, the network 600 may include one or more Zdeg2 608 components. The Zdeg components 604, 606, 608 of the Zdeg network 600 may be used to change the gain of a receiver. The Zdeg network 600 may reconfigure the passive mixer core previously illustrated in FIG. 5.

Figure 7:
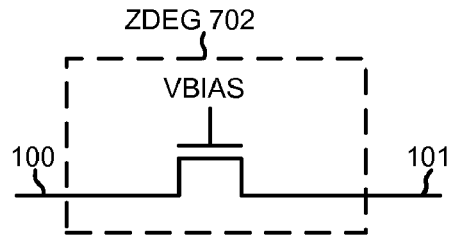
FIG. 7 illustrates an example of a component that may be utilized in the degenerative-impedance gain-tuning network.
Figure 8:
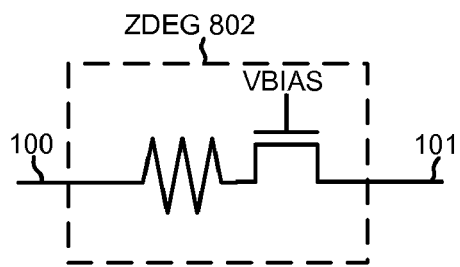
FIG. 8 illustrates another example of a component that may be utilized in the degenerative-impedance gain-tuning network.
Figure 9:
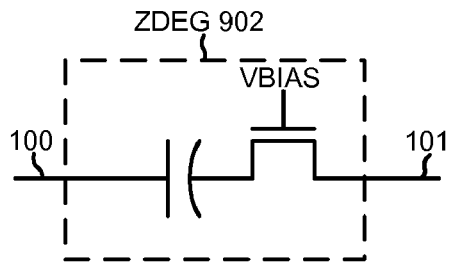
FIG. 9 illustrates another configuration of a component that may be utilized in the degenerative-impedance gain-tuning network.

Changing a receiver gain by reconfiguring the passive mixer core, the TIA noise contribution to the receiver NF may become larger than all other receiver noise contributions put together, when a 25% duty cycle of the local oscillator (LO) signal is used for the downconversion in the state-of-the art SAW-less receivers. When the receiver gain is stepped down by bleeding a part of the received RF signal through a reconfigured shunt mixer path, the contribution of the TIA noise to the receiver output noise may increase. In this example, the gain from the TIA noise to the receiver output is large as being inversely proportional to the mixer shunt path small ON impedance. With both the receiver gain reduced and the TIA noise increased, the receiver noise figure may be degraded to the extent that the system fails to meet the NF requirements. Applying impedance degeneration through the Zdeg network 600 to the passive mixer core may allow for a reduction of the TIA noise contribution to the receiver NF when reducing the receiver gain. However, as a result of a larger impedance created at the output of the LNA, the receiver triple-beat performance may be degraded. For a larger impedance seen by the TIA provided (i.e., reduce the noise contribution) and a smaller impedance seen by the LNA (good linearity supported), as provided by the network 600, an optimal trade-off between the receiver NF and voltage gain may be achieved, without compromising other receiver performance. The Zdeg network 600 may be implemented using a resistive, a capacitive, or a switch network as shown in FIGS. 7-9.

Different receiver gain modes may be implemented by sizing the resistor/capacitor/switch network parameters in accordance with the system noise-figure/gain/linearity requirements. For example, using a switch tuning network, shown in FIG. 12 below, 9 dB of voltage gain is traded for only 1.7 dB of noise figure. The implementation of the Zdeg network 600 may offer advantages to multi-mode receivers. For example, an acceptable trade-off between the receiver voltage gain and TIA noise contribution may be achieved. Another advantage is providing an acceptable trade-off between the receiver noise figure and voltage gain. In addition, an acceptable trade-off between a desired lower impedance seen by the LNA and a higher impedance seen by the TIA may be achieved. Furthermore, fewer number of components may be used as the shunt gain-tuning network path is shared between the I and Q receiver signal channels.

Referring to FIG. 6, the linear gain of the receiver may be approximately scaled by a degenerated-impedance gain-tuning network as given by Equation (1) (25% LO duty cycle assumed).

$$\text{voltage-gain} \sim \cfrac{1}{1 + \cfrac{Z_{deg0}Z_{deg1}}{Z_{deg0}+Z_{deg1}}\cfrac{2}{Z_{LNA}} + \cfrac{Z_{deg0}Z_{deg1}}{Z_{deg0}+Z_{deg1}}\cfrac{1}{Z_{deg2}}}.$$ Equation (1)

$Z_{deg0}$ and $Z_{deg1}$ stand for the degenerated impedances, and $Z_{LNA}$ for the output differential impedance of the low-noise amplifier (LNA) shown in FIG. 6. For example, by setting $Z_{deg0}=\infty$ (created by turning off a switch transistor in the Zdeg branch, for example), $Z_{deg1}=Z_{LNA}/4$, and $Z_{deg2}=Z_{LNA}/2$, the voltage gain of the receiver may be approximately scaled down by a factor of 2 (i.e., 6 dB).

FIGS. 7-9 illustrate several examples of the Zdeg components 604, 606, 608 that may be utilized in the Zdeg network 600. In each case illustrated, the first lead 100 to the left is the lead of a Zdeg impedance element 604, 606, 608 that is part of the Zdeg network 600 that is coupled to LNA 28. The second lead 101 to the right may be the lead of a Zdeg impedance element 604, 606, 608 within the Zdeg network 600 that is coupled to switching core 48.

In one example, the Zdeg element 702 illustrates a switch element incorporating a transistor. In another configuration, the Zdeg element 802 is a resistive element incorporating a resistor coupled to a transistor. Further, the Zdeg element 902 may be a capacitive element including a capacitor coupled to a transistor. The transistors of various dimensions within the Zdeg elements 702, 802, 902 may be switched to control the gain of the receiver. By switching the transistors, the system turns on and/or turns off certain Zdeg elements or branches of the Zdeg network.

Figure 10:
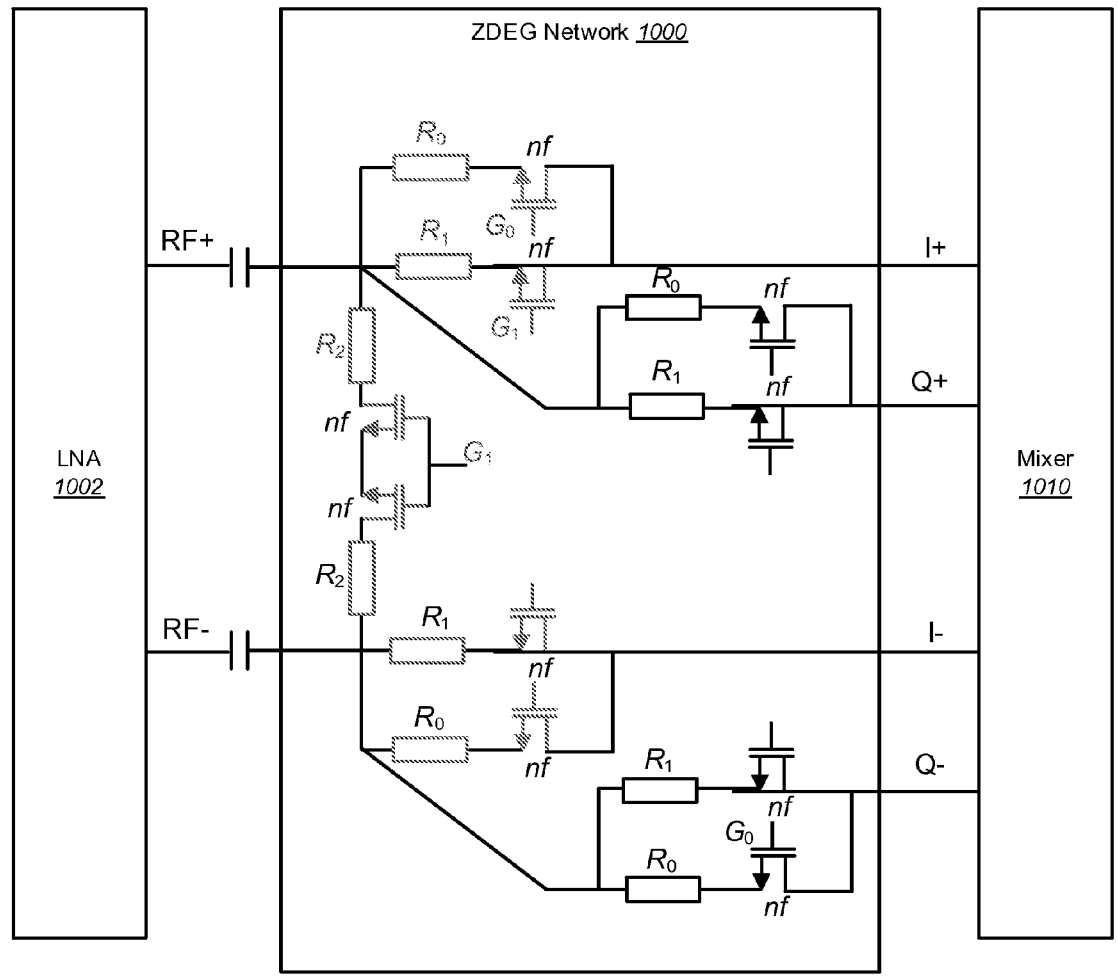
FIG. 10 is a block diagram illustrating one configuration of a degenerative-impedance gain-tuning network with resistive components between an LNA and a mixer in a receiver.

FIG. 10 is a block diagram illustrating one configuration of a Zdeg network 1000 between an LNA 1002 and a mixer 1010 in a receiver. In one example, the Zdeg network 1000 includes resistive Zdeg elements (as illustrated in FIG. 8). The resistive Zdeg elements may be Zdeg0 604, Zdeg1 606 and/or Zdeg2 608. As illustrated, the various impedance elements may be positioned in series or parallel. The gain of the receiver may be changed by switching one or more transistors within the Zdeg network 1000.

Figure 11:
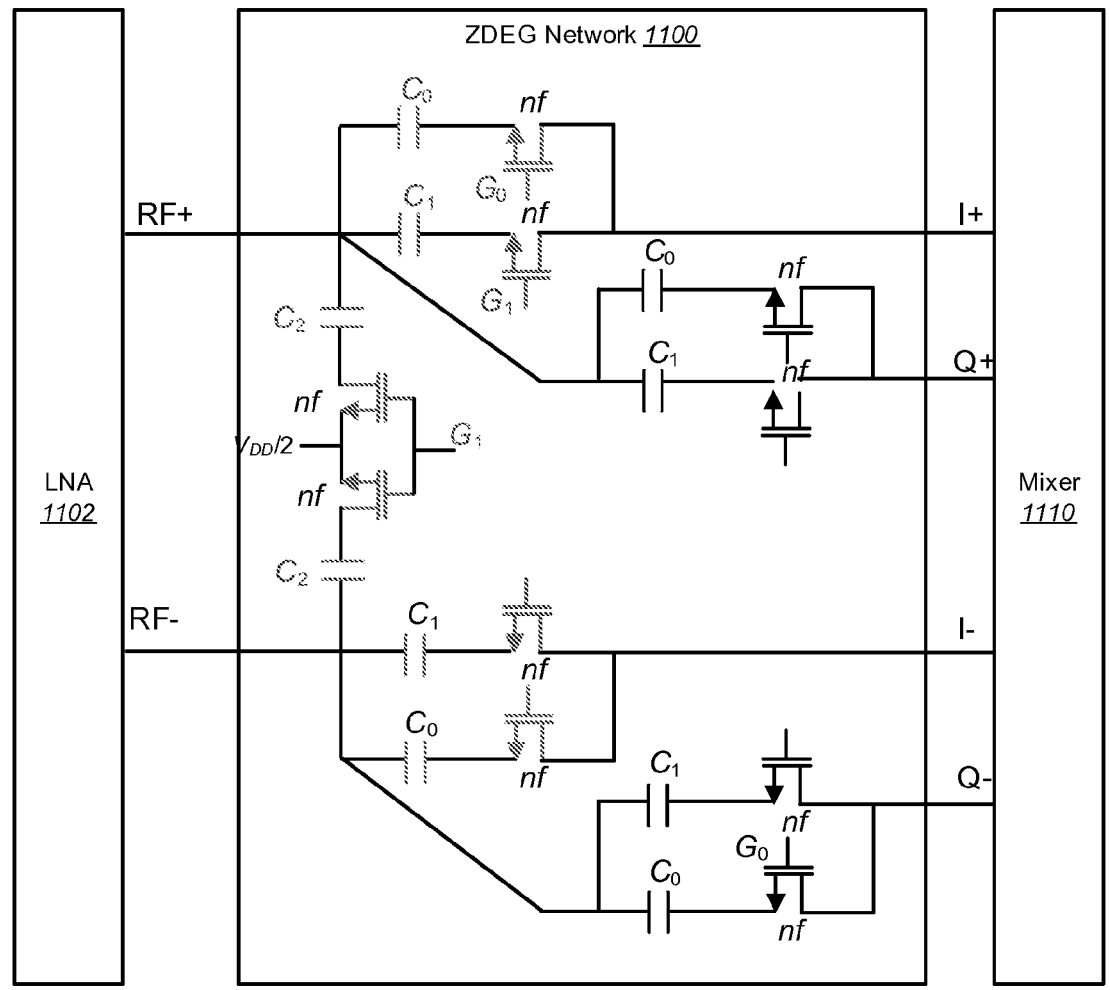
FIG. 11 is a block diagram illustrating one configuration of a degenerative-impedance gain-tuning network with capacitive components between an LNA and a mixer in a receiver.

FIG. 11 is a block diagram illustrating another configuration of a Zdeg network 1100 between an LNA 1102 and a mixer 1110 in a receiver. In one example, the Zdeg network 1100 includes capacitive Zdeg elements (as illustrated in FIG. 9). The capacitive Zdeg elements may be Zdeg0 604, Zdeg1 606 and/or Zdeg2 608. As illustrated, the various impedance elements may be positioned in series or parallel. The gain of the receiver may be changed by switching one or more transistors within the Zdeg network 1100.

Figure 12:
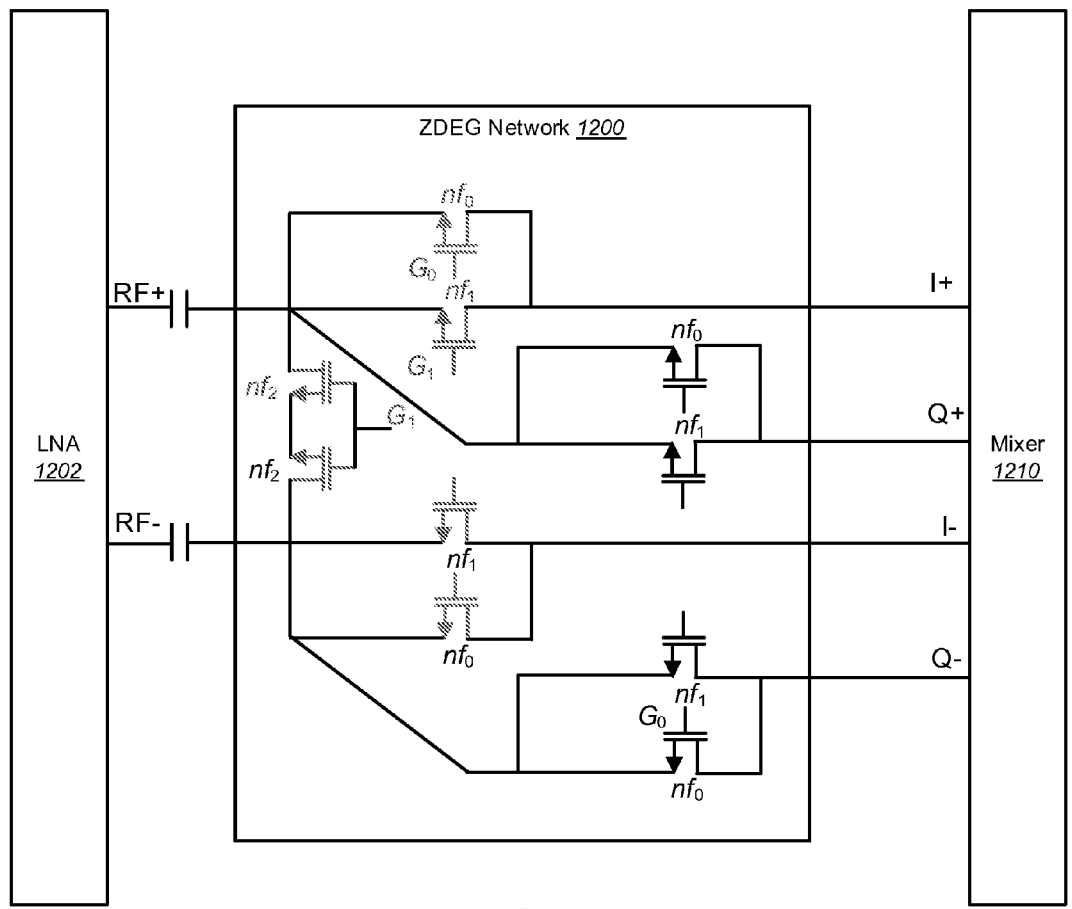
FIG. 12 is a block diagram illustrating one configuration of a degenerative-impedance gain-tuning network with switching components between an LNA and a mixer in a receiver.

FIG. 12 is a block diagram illustrating yet another configuration of a Zdeg network 1200 between an LNA 1202 and a mixer 1210 in a receiver. In one example, the Zdeg network 1200 includes switching Zdeg elements (as illustrated in FIG. 7). The switching Zdeg elements may be Zdeg0 604, Zdeg1 606 and/or Zdeg2 608. As illustrated, the various impedance elements may be positioned in series or parallel. The gain of the receiver may be changed by switching one or more transistors within the Zdeg network 1200.

Figure 13:
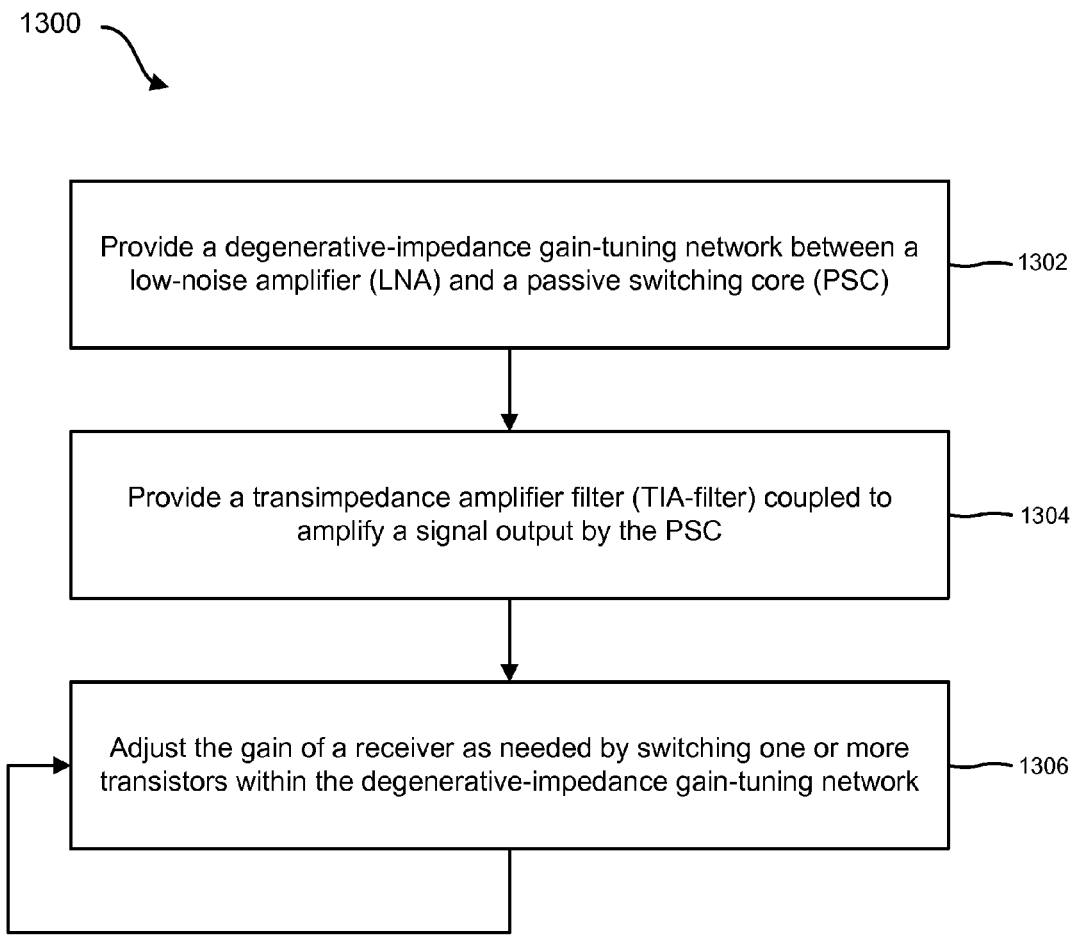
FIG. 13 is a flow diagram illustrating one example of a method for adjusting the gain of a receiver.

FIG. 13 is a flow diagram illustrating one example of a method 1300 for adjusting the gain of a receiver. The gain may be adjusted using an impedance degenerative network 500 (Zdeg network) as previously described. In one example, a degenerative-impedance gain-tuning network may be provided 1302. The network may be provided 1302 between a low-noise amplifier (LNA) and a passive switching core (PSC). In one configuration, a transimpedance amplifier filter (TIA-filter) may be provided 1304. The TIA-filter may be coupled to amplify a signal output by the PSC. In addition, the gain of the receiver may be adjusted 1306. The gain may be adjusted 1306 by switching one or more transistors as necessary. The one or more transistors may be within the degenerative-impedance gain-tuning network. As shown, the gain of the receiver may be adjusted continuously while the receiver is in use or operation.

Figure 14:
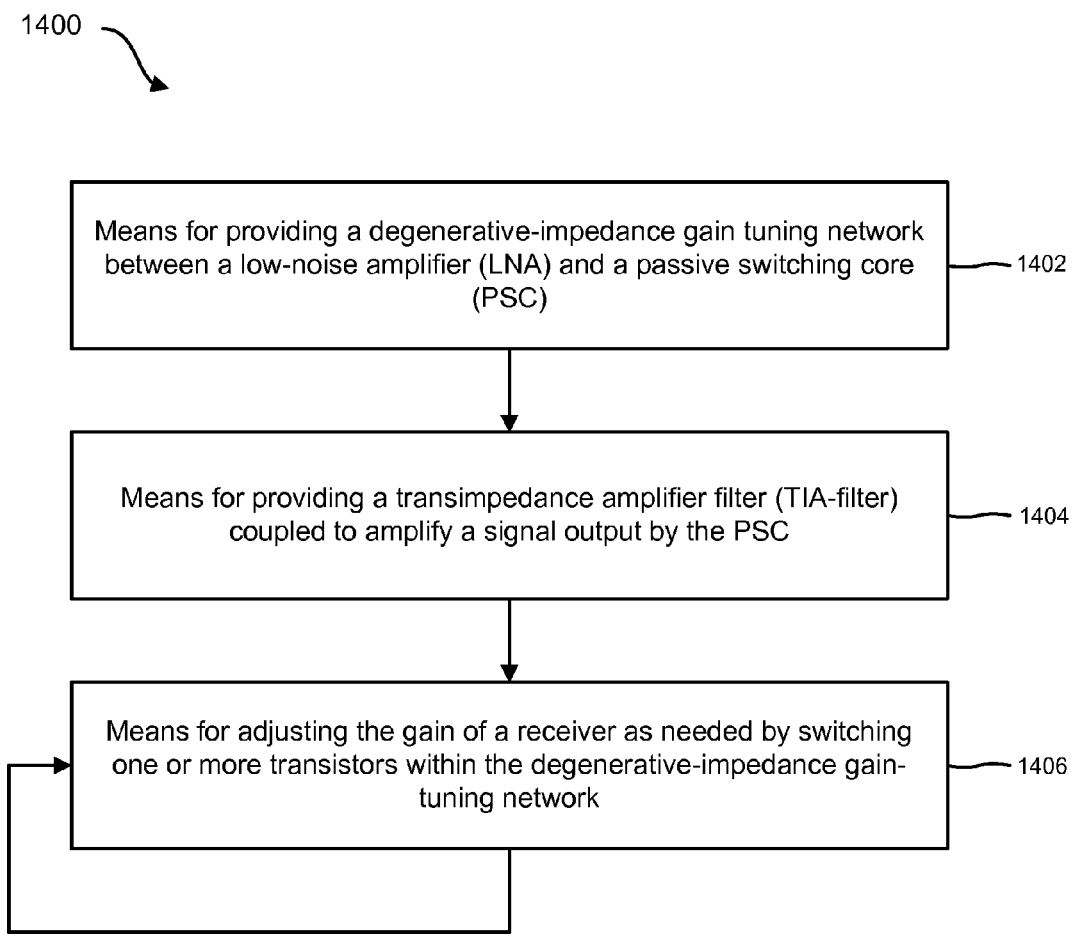
FIG. 14 illustrates means-plus-function blocks corresponding to the method shown in FIG. 13.

The method of FIG. 13 described above may be performed by various hardware and/or software component(s) and/or module(s) corresponding to the means-plus-function blocks illustrated in FIG. 14. In other words, blocks 1302 through 1306 illustrated in FIG. 13 correspond to means-plus-function blocks 1402 through 1406 illustrated in FIG. 14.

Figure 15:
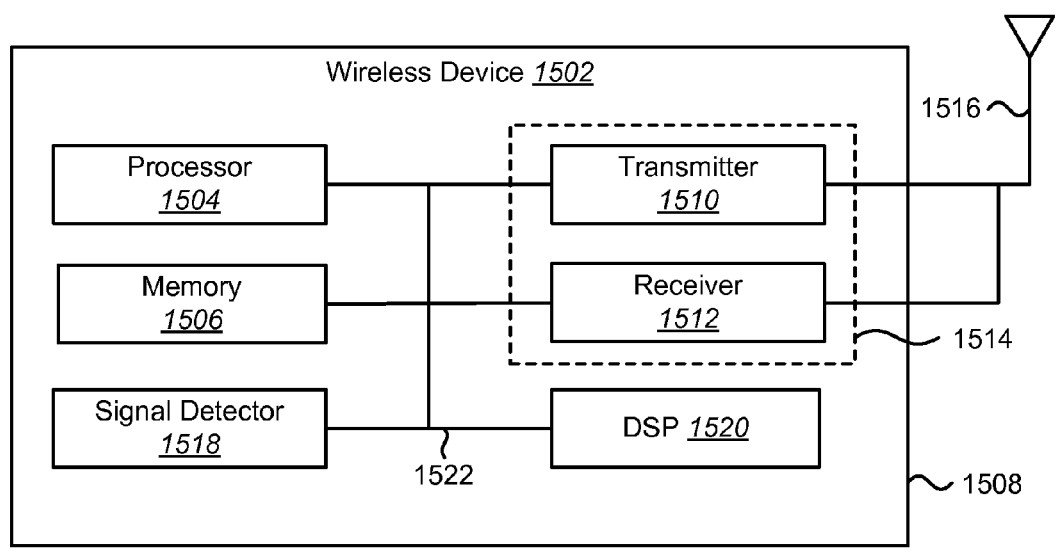
FIG. 15 illustrates various components that may be utilized in a wireless device.

FIG. 15 illustrates various components that may be utilized in a wireless device 1502. The wireless device 1502 is an example of a device that may be configured to implement the various methods described herein. The wireless device 1502 may be a remote station.

The wireless device 1502 may include a processor 1504 which controls operation of the wireless device 1502. The processor 1504 may also be referred to as a central processing unit (CPU). Memory 1506, which may include both read-only memory (ROM) and random access memory (RAM), provides instructions and data to the processor 1504. A portion of the memory 1506 may also include non-volatile random access memory (NVRAM). The processor 1504 typically performs logical and arithmetic operations based on program instructions stored within the memory 1506. The instructions in the memory 1506 may be executable to implement the methods described herein.

The wireless device 1502 may also include a housing 1508 that may include a transmitter 1510 and a receiver 1512 to allow transmission and reception of data between the wireless device 1502 and a remote location. The transmitter 1510 and receiver 1512 may be combined into a transceiver 1514. An antenna 1516 may be attached to the housing 1508 and electrically coupled to the transceiver 1514. The wireless device 1502 may also include (not shown) multiple transmitters, multiple receivers, multiple transceivers and/or multiple antenna.

The wireless device 1502 may also include a signal detector 1518 that may be used to detect and quantify the level of signals received by the transceiver 1514. The signal detector 1518 may detect such signals as total energy, pilot energy per pseudonoise (PN) chips, power spectral density, and other signals. The wireless device 1502 may also include a digital signal processor (DSP) 1520 for use in processing signals.

The various components of the wireless device 1502 may be coupled together by a bus system 1522 which may include a power bus, a control signal bus, and a status signal bus in addition to a data bus. However, for the sake of clarity, the various busses are illustrated in FIG. 15 as the bus system 1522.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated by FIG. 15, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A circuit comprising:
    a low noise amplifier (LNA) having a first output lead and a second output lead;
    a passive switching core (PSC) having a first signal input lead, a second signal input lead, a first signal output lead, a second signal output lead, a first local oscillator input lead, and a second local oscillator input lead;
    a transimpedance amplifier filter (TIA-filter) having a first input lead, a second input lead, a first output lead, and a second output lead;
    a degenerative-impedance gain-tuning network (Zdeg network) having a first Zdeg network input lead, a second Zdeg network input lead, a first Zdeg network output lead and a second Zdeg network output lead, wherein the first Zdeg network input lead is coupled to the first output lead of the LNA and the second Zdeg network input lead is coupled to the second output lead of the LNA, and wherein the first Zdeg network output lead is coupled to the first signal input lead of the PSC and the second Zdeg network output lead is coupled to the second signal input lead of the PSC;
    wherein the LNA, the Zdeg network, the PSC, and the TIA-filter together form a receiver, and wherein a receiver gain is adjusted by the Zdeg network.

2. The circuit of claim 1, wherein the Zdeg network comprises a plurality of degenerative impedance elements (Zdegs), wherein each Zdeg comprises a first Zdeg lead and a second Zdeg lead.

3. The circuit of claim 2, wherein each Zdeg further comprises a transistor whereby each Zdeg is turned on and turned off.

4. The circuit of claim 3, wherein the receiver gain is adjusted by turning one or more of the Zdegs on or off.

5. The circuit of claim 2, wherein each of the Zdegs is taken from the group consisting of: a transistor, a resistor and a transistor coupled in series, and a capacitor and transistor coupled in series.

6. The circuit of claim 1, wherein there is no active transconductance amplifier disposed in a signal path between the first and second output leads of the LNA and the first and second input leads of the PSC.

7. The circuit of claim 6, wherein the PSC includes:
a first field effect transistor (FET) having a first terminal coupled to the first Zdeg network output lead, a second terminal coupled to the first input lead of the TIA, and a third gate terminal coupled to the first local oscillator input lead of the PSC;
a second FET having a first terminal coupled to the first Zdeg network output lead, a second terminal coupled to the second input lead of the TIA, and a third gate terminal coupled to the second local oscillator input lead of the PSC;
a third FET having a first terminal coupled to the second Zdeg network output lead, a second terminal coupled to the first input lead of the TIA, and a third gate terminal coupled to receive the second local oscillator input lead of the PSC; and
a fourth FET having a first terminal coupled to the second Zdeg network output lead, a second terminal coupled to the second input lead of the TIA, and a third gate terminal coupled to receive the first local oscillator input lead of the PSC.

8. The circuit of claim 6, wherein the TIA-filter has a filter characteristic and serves as a baseband filter in the receiver.

9. The circuit of claim 1, wherein the receiver is a receiver in a cellular telephone.

10. The circuit of claim 6, wherein a first local oscillator signal on the first local oscillator input lead of the PSC is active for fifty percent of the time and less, and wherein a second local oscillator signal on the second local oscillator input lead of the PSC is active for fifty percent of the time and less.

11. The circuit of claim 6, wherein the Zdeg network is programmable to have one of a plurality of impedances.

12. A wireless device comprising:
a transmitter;
a receiver, wherein the receiver comprises:
  a low noise amplifier (LNA) having a first output lead and a second output lead;
  a passive switching core (PSC) having a first signal input lead, a second signal input lead, a first signal output lead, a second signal output lead, a first local oscillator input lead, and a second local oscillator input lead;
  a transimpedance amplifier filter (TIA-filter) having a first input lead, a second input lead, a first output lead, and a second output lead;
  a degenerative-impedance gain-tuning network (Zdeg network) having a first Zdeg network input lead, a second Zdeg network input lead, a first Zdeg network output lead and a second Zdeg network output lead, wherein the first Zdeg network input lead is coupled to the first output lead of the LNA and the second Zdeg network input lead is coupled to the second output lead of the LNA, and wherein the first Zdeg network output lead is coupled to the first signal input lead of the PSC and the second Zdeg network output lead is coupled to the second signal input lead of the PSC;
wherein the LNA, the Zdeg network, the PSC, and the TIA-filter together form a receiver, and wherein a receiver gain is adjusted by the Zdeg network.

13. The wireless device of claim 12, wherein the Zdeg network comprises a plurality of degenerative impedance elements (Zdegs), wherein each Zdeg comprises a first Zdeg lead and a second Zdeg lead.

14. The wireless device of claim 13, wherein each Zdeg further comprises a transistor whereby each Zdeg is turned on and turned off.

15. The wireless device of claim 14, wherein the receiver gain is adjusted by turning one or more of the Zdegs on or off.

16. The wireless device of claim 13, wherein each of the Zdegs is taken from the group consisting of: a transistor, a resistor and a transistor coupled in series, and a capacitor and transistor coupled in series.

17. The wireless device of claim 12, wherein there is no active trans-conductance amplifier disposed in a signal path between the first and second output leads of the LNA and the first and second input leads of the PSC.

18. The wireless device of claim 17, wherein the PSC includes:
a first field effect transistor (FET) having a first terminal coupled to the first Zdeg network output lead, a second terminal coupled to the first input lead of the TIA, and a third gate terminal coupled to the first local oscillator input lead of the PSC;
a second FET having a first terminal coupled to the first Zdeg network output lead, a second terminal coupled to the second input lead of the TIA, and a third gate terminal coupled to the second local oscillator input lead of the PSC;
a third FET having a first terminal coupled to the second Zdeg network output lead, a second terminal coupled to the first input lead of the TIA, and a third gate terminal coupled to receive the second local oscillator input lead of the PSC; and
a fourth FET having a first terminal coupled to the second Zdeg network output lead, a second terminal coupled to the second input lead of the TIA, and a third gate terminal coupled to receive the first local oscillator input lead of the PSC.

19. The wireless device of claim 18, wherein the TIA-filter has a filter characteristic and serves as a baseband filter in the receiver.

20. The wireless device of claim 12, wherein the receiver is a receiver in a cellular telephone.

21. The wireless device of claim 17, wherein a first local oscillator signal on the first local oscillator input lead of the PSC is active for fifty percent of the time and less, and wherein a second local oscillator signal on the second local oscillator input lead of the PSC is active for fifty percent of the time and less.

22. The wireless device of claim 17, wherein the Zdeg network is programmable to have one of a plurality of impedances.

23. The wireless device of claim 12, wherein the wireless device is a handset.

24. A method for adjusting the gain of a receiver, the method comprising:
providing a degenerative-impedance gain-tuning network (Zdeg network) with one or more transistors and having a first Zdeg network input lead, a second Zdeg network input lead, a first Zdeg network output lead and a second Zdeg network output lead, wherein the first Zdeg network input lead is coupled to a first output lead of a low-noise amplifier (LNA) and the second Zdeg network input lead is coupled to a second output lead of the LNA, and wherein the first Zdeg network output lead is coupled to a first signal input lead of a passive switching core (PSC) and the second Zdeg network output lead is coupled to a second signal input lead of the PSC;
providing a transimpedance amplifier filter (TIA-filter) having a first input lead, a second input lead, a first output lead, and a second output lead; and adjusting the gain of a receiver by switching one or more transistors on or off, wherein the LNA, the Zdeg network, the PSC, and the TIA-filter together form the receiver.

25. A receiver comprising:
low-noise amplifier (LNA) means;
passive switching core (PSC) means;
degenerative-impedance gain-tuning network (Zdeg network) means with one or more transistors and having a first Zdeg network input lead, a second Zdeg network input lead, a first Zdeg network output lead and a second Zdeg network output lead, wherein the first Zdeg network input lead is coupled to a first output lead of the LNA means and the second Zdeg network input lead is coupled to a second output lead of the LNA means, and wherein the first Zdeg network output lead is coupled to a first signal input lead of the PSC means and the second Zdeg network output lead is coupled to a second signal input lead of the PSC means;
transimpedance amplifier filter (TIA-filter) means having a first input lead, a second input lead, a first output lead, and a second output lead; and
means for adjusting gain of the receiver by switching one or more transistors on or off.

26. The receiver of claim 25, wherein the Zdeg network means comprise a plurality of degenerative impedance elements (Zdegs), wherein each Zdeg comprises a first Zdeg lead and a second Zdeg lead.

27. The receiver of claim 26, wherein each Zdeg further comprises a transistor whereby each Zdeg is turned on and turned off.

28. The receiver of claim 27, wherein the receiver gain is adjusted by turning one or more of the Zdegs on or off.

29. The receiver of claim 26, wherein each of the Zdegs is taken from the group consisting of: a transistor, a resistor and a transistor coupled in series, and a capacitor and transistor coupled in series.

30. The receiver of claim 25, wherein there is no active trans-conductance amplifier disposed in a signal path between the first and second output leads of the LNA means and the first and second input leads of the PSC means.

* * * * *